United States Patent
Wang

(10) Patent No.: US 8,389,403 B2
(45) Date of Patent: Mar. 5, 2013

(54) SEMICONDUCTOR DEVICE AND METHOD FOR MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/039,149

(22) Filed: Feb. 28, 2008

(65) Prior Publication Data

US 2008/0157155 A1 Jul. 3, 2008

Related U.S. Application Data

(63) Continuation of application No. PCT/JP2005/015942, filed on Aug. 31, 2005.

(51) Int. Cl.
*G11C 11/00* (2006.01)

(52) U.S. Cl. ........ 438/642; 438/643; 438/652; 438/656; 438/684; 438/685; 257/296

(58) Field of Classification Search .......... 257/296–311, 257/253–256, E21.647–E21.649; 438/642–657, 438/684–685, 687, 253–256
See application file for complete search history.

(56) References Cited

U.S. PATENT DOCUMENTS

| | | | |
|---|---|---|---|
| 6,150,690 | A | 11/2000 | Ishibashi et al. |
| 6,303,429 | B1 | 10/2001 | Ishibashi et al. |
| 6,323,558 | B1 | 11/2001 | Jeong |
| 6,407,422 | B1 * | 6/2002 | Asano et al. .................. 257/306 |
| 6,548,343 | B1 | 4/2003 | Summerfelt et al. |
| 6,753,566 | B2 * | 6/2004 | Kutsunai et al. .............. 257/306 |
| 6,818,935 | B2 * | 11/2004 | Kweon et al. ................. 257/295 |
| 7,332,764 | B2 * | 2/2008 | Choi et al. .................... 257/300 |
| 7,511,349 | B2 * | 3/2009 | Tsai et al. ..................... 257/382 |
| 2003/0073252 | A1 * | 4/2003 | Park et al. ......................... 438/3 |
| 2003/0194858 | A1 * | 10/2003 | Lee et al. ...................... 438/643 |
| 2004/0166596 | A1 | 8/2004 | Sashida et al. |
| 2005/0074976 | A1 * | 4/2005 | Kim .............................. 438/692 |
| 2006/0097397 | A1 * | 5/2006 | Russell ......................... 257/762 |
| 2006/0099804 | A1 * | 5/2006 | Ramappa et al. ............. 438/652 |

FOREIGN PATENT DOCUMENTS

| | | |
|---|---|---|
| JP | 10-242423 A | 9/1998 |
| JP | 2000-31421 A | 1/2000 |
| JP | 2001-244426 A | 9/2001 |
| JP | 2003-68993 A | 3/2003 |
| JP | 2004-153031 A | 5/2004 |

OTHER PUBLICATIONS

International Search Report of PCT/JP2005/015942, date of mailing Nov. 1, 2005.

* cited by examiner

*Primary Examiner* — Robert J Hoffberg
*Assistant Examiner* — Ali Naraghi
(74) *Attorney, Agent, or Firm* — Fujitsu Patent Center

(57) ABSTRACT

According to one embodiment, after forming transistors on a semiconductor substrate, a stopper layer and an interlayer insulating film are formed. Then, a contact hole is formed in the interlayer insulating film and a copper film is formed on the interlayer insulating film to bury the inside of the contact hole with copper. After that, the copper film on the interlayer insulating film is removed by low-pressure CMP polishing or ECMP polishing to planarize a surface thereof to form plugs. Thereafter, a barrier metal, a lower electrode, a ferroelectric film, and an upper electrode are formed. In this manner, a semiconductor device (FeRAM) having a ferroelectric capacitor is formed.

9 Claims, 12 Drawing Sheets

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/015942, filed Aug. 31, 2005, the entire contents of which are incorporated herein by reference.

TECHNICAL FIELD

It is related to a semiconductor device provided with ferroelectric capacitors or high dielectric capacitors, which are formed by sandwiching a ferroelectric film or a high dielectric film between one pair of electrodes, and to a method for manufacturing the semiconductor device. In particular, it relates to a semiconductor device provided with a memory cell made of a ferroelectric capacitor or a high dielectric capacitor and a transistor, and to a method for manufacturing the semiconductor device.

BACKGROUND

Recently, it has been highly required that a large volume of data can be processed at a higher speed along with the development of digital technologies. In addition, it has been also required that semiconductor devices used in electronic equipment be further densely integrated and show higher performance. Accordingly, there has been widely studied technologies that use, to provide a semiconductor storing device (DRAM: a dynamic random-access memory) with higher integration, ferroelectric materials or high dielectric materials in place of conventionally used silicon oxides or silicon nitrides as a material of an insulating film of capacitor in the DRAM.

A ferroelectric random access memory (FeRAM) is a nonvolatile semiconductor memory device using a ferroelectric for an insulating film (a capacity insulating film) of a capacitor and stores data by utilizing a hysteresis characteristic of the ferroelectric. The ferroelectric has a characteristic that polarization is caused when a voltage is applied and that spontaneous polarization is maintained even after the voltage is stopped to be applied. In addition, when the polarity of the applying voltage is reversed, the polarity of the spontaneous polarization is also reversed. Accordingly, it is possible to store data by associating one polarity with "1" and the other polarity with "0". The stored data can be read out by detecting a polarity of the spontaneous polarization.

The ferroelectric film constituting the capacitor of FeRAM is made of lead zirconate titanate (PZT), PLZT in which La is doped into PZT, a PZT-based material in which a small amount of Ca, Sr, or Si is doped, Bi layered structure compounds, such as $SrBi_2Ta_2O_9$(SBT, Y1) and $SrBi_2(Ta, Nb)_2O_9$ (SBTN, YZ), and is formed by a sol-gel method, a sputtering method, a metal organic chemical vapor deposition (MOCVD) method, or the like.

In general, an amorphous or microcrystalline ferroelectric film is formed on a lower electrode by using these film forming methods, and thereafter a crystal structure thereof is changed by thermal processing to have a perovskite structure or bismuth layered structure. As a material for an electrode of a capacitor, it is required to use a material which is less likely to be oxidized or which can maintain conductivity even after being oxidized. In general, platinum metals such as platinum (Pt), iridium (Ir), iridium oxide and the like, or oxidants thereof are widely used. In addition, aluminum (Al) is a generally used material for a wiring as in the general semiconductor device.

Similar to other semiconductor devices, FeRAM is also required to be further densely integrated and to show higher performance, so that it is needed to reduce an area of a cell in the feature. To reduce the area of the cell, it has been known that it is effective to use a stack structure in place of a conventional planar structure. Here, the stack structure means a structure that a capacitor is formed directly on a plug (a contact plug) formed on a drain of a transistor constituting a memory cell. In a conventional FeRAM with a stack structure, a capacitor is formed directly on a W (tungsten) plug by laminating a barrier metal, a lower electrode, a ferroelectric film, and an upper electrode in this order. The barrier metal has a function to prevent the W plug from oxidation. Since a material having the effect of the barrier metal together with the effect of the lower electrode is often selected, the barrier metal and the lower electrode cannot be clearly separated. However, the barrier metal and the lower electrode are generally formed by combination of at least two films, which are selected from a TiN film, a TiAlN film, an Ir film, an $IrO_2$ film, and an $SRO(SrRuO_3)$ film.

In Japanese Patent Laid-open No. 2000-31421, for the purpose of preventing excessive necking of a storage node, it is disclosed that a recessed W plug filling a part of a contact hole is formed, and thereafter a conductive film (for example, a Cu film) and an insulating film (for example, SiON film) are sequentially formed on an entire surface thereof, and then the conductive film and the insulating film are polished by chemical mechanical polishing (CMP) to form a contact plug with a structure in which an insulating material is buried in the center portion thereof.

In addition, In Japanese Patent Laid-open No. Hei 10-242423, there is disclosed a semiconductor device in which a second plug formed by filling a contact hole in a second interlayer insulating film with W is laminated on a first plug formed by filling a contact hole in a first interlayer insulating film with polysilicon, and a capacitor is formed on this second plug.

Furthermore, In Japanese Patent Laid-open No. 2003-68993, it is proposed that a W plug is formed after a hydrogen permeation prohibiting film made of TiAlN, TiN, TaN or the like is formed on an inner surface of a contact hole to avoid deteriorating characteristics of a capacity insulating film at the time when processing is carried out in a high concentration hydrogen atmosphere.

SUMMARY

It is one aspect of the embodiments discussed herein to provide a semiconductor device including a semiconductor substrate, an impurity region formed by introducing impurities into the semiconductor substrate, an interlayer insulating film formed over the semiconductor substrate, a conductive plug formed through the interlayer insulating film, and a capacitor provided over the conductive capacitor, wherein the capacitor includes a lower electrode, which is electrically connected to the impurity region through the conductive plug, a dielectric film made of a ferroelectric or a high dielectric on the lower electrode, and an upper electrode on the dielectric film, and a copper film with a flat upper surface is provided at least in an upper portion of the conductive plug or between the conductive plug and the lower electrode of the capacitor

DETAILED DESCRIPTION OF THE PREFERRED EMBODIMENTS

Figure 1:
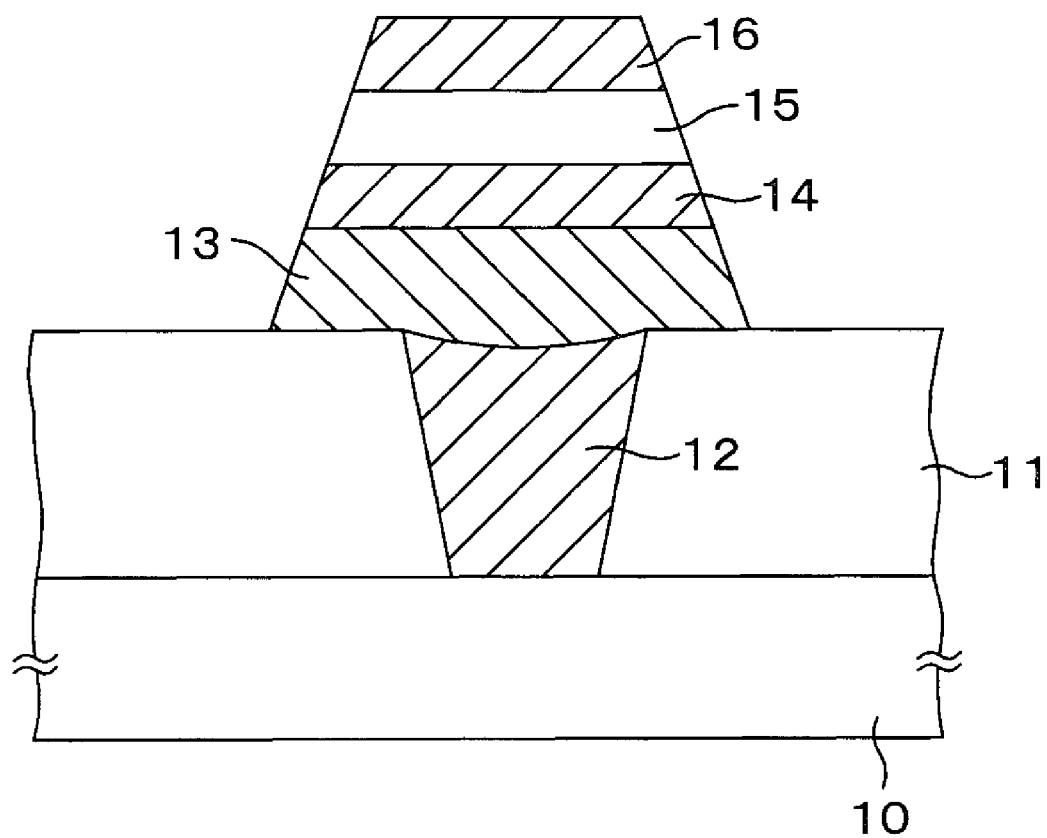
FIG. 1 is a schematic view showing a problem of the conventional technology.

The inventor considers that the above-described conventional technologies have problems as described below. FIG. 1 is a schematic view showing a problem of the conventional technology, which is drawn based on a picture of scanning Electron Microscope (SEM). In FIG. 1, reference numeral 10 denotes a semiconductor substrate, reference numeral 11 denotes an interlayer insulating film, reference numeral 12 denotes a W (tungsten) plug, reference numeral 13 denotes a barrier metal, reference numeral 14 denotes a lower electrode of a capacitor, reference numeral 15 denotes a ferroelectric film, and reference numeral 16 denotes an upper electrode of the capacitor.

In all of the above-described conventional technologies, W is buried into the contact hole formed in the interlayer insulating film 11 on the semiconductor substrate 10, and thereafter excessive W on the interlayer insulating film 11 is polished by CMP so as to form a plug 12 by leaving W only in the contact hole. However, as shown in FIG. 1, a recess (dishing or erosion) is caused in a surface of the plug by the CMP polishing. If the recess is caused in this manner, the crystallinity of the barrier metal 13 and the lower electrode 14 in a portion over the plug 12 differs from that in a portion over a planar surface, so that the crystallinity of the ferroelectric film 15 formed on the lower electrode 14 deteriorates. As a result, such problems arise that the switching charges are decreased and the reliability is lowered, so that it is made difficult to perform a low-voltage operation.

Figure 2:
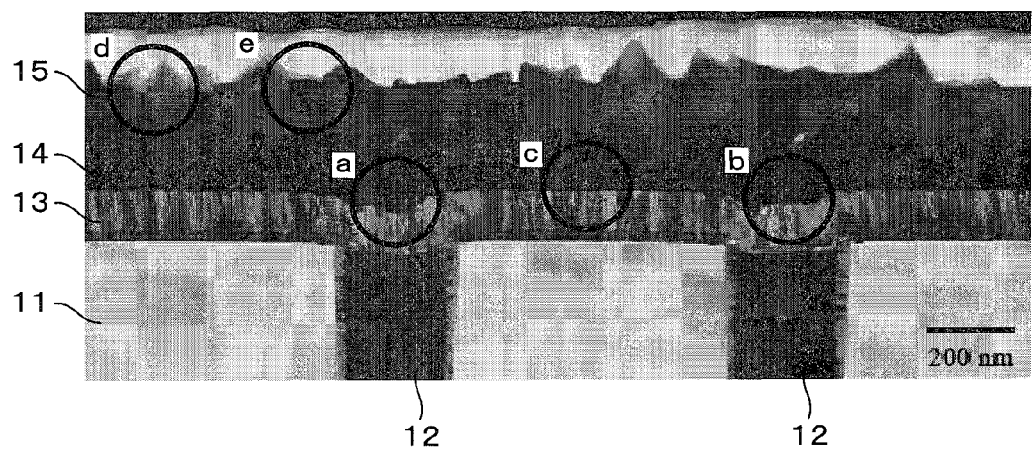
FIG. 2 is an electron micrograph showing a state where the interlayer insulating film and the W plug are formed on the semiconductor substrate, and the barrier metal, the lower electrode, and the ferroelectric film 15 are further formed thereon.
Figure 3:
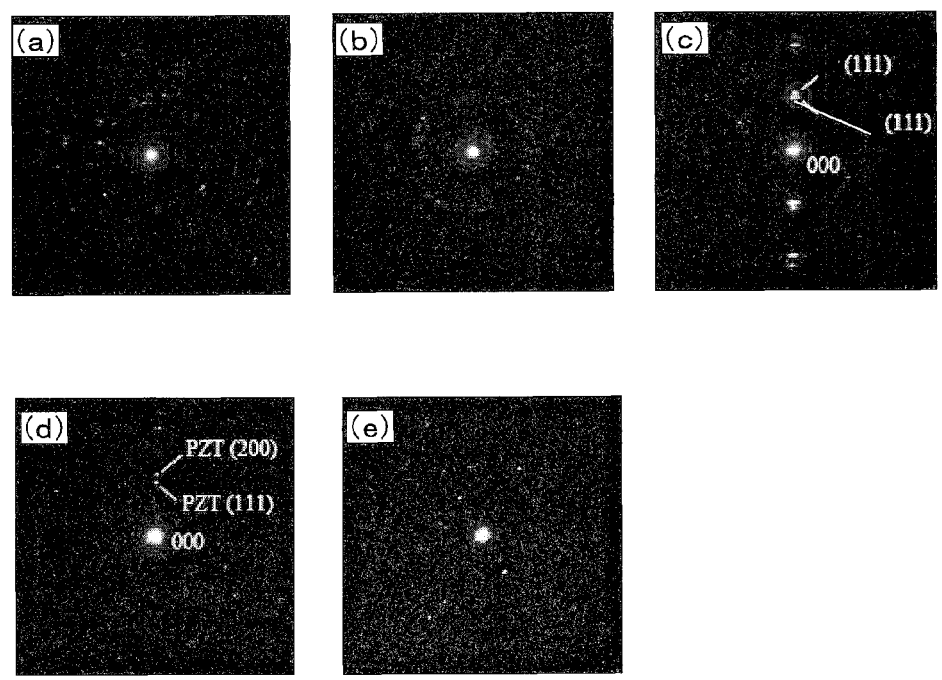
FIG. 3 is control field electron diffraction images in portions shown by "a" to "e" in FIG. 2.

FIG. 2 is an electron micrograph showing a state where the interlayer insulating film 11 and the W plug 12 are formed on the semiconductor substrate, and the barrier metal 13, the lower electrode 14, and the ferroelectric film 15 are further formed thereon. In addition, FIG. 3 is control field electron diffraction images in portions shown by "a" to "e" in FIG. 2. It can be seen from the electron diffraction image of FIG. 3 that in a planar interface between the barrier metal 13 and the lower electrode 14 (the portion shown by "c" in FIG. 2), the crystal is oriented in (111) direction. In addition, it can be seen from the electron diffraction image of FIG. 3 that the ferroelectric film 15 (PZT) is oriented in (111) direction in a portion (shown by "d" in FIG. 2) over the planar interface.

However, at the interface (shown by "a" and "b" in FIG. 2) between the barrier metal 13 and lower electrode 14 over the recessed W plug 12, it can be seen from electron diffraction images FIG. 3 that the crystal is not orientated in (111) direction. In addition, it can be seen from the electron diffraction image shown in FIG. 3 that the ferroelectric film 15 (PZT) is not oriented in (111) direction in a portion (shown by "e" in FIG. 2) over the interface portion "a".

That is to say, crystal disorder is generated in the ferroelectric film due to the influence of the recess formed on the W plug, so that FeRAM characteristics are extremely deteriorated.

Hereinafter, preferred embodiments will be described by referring to the accompanying drawings.

First Embodiment

Figure 4:
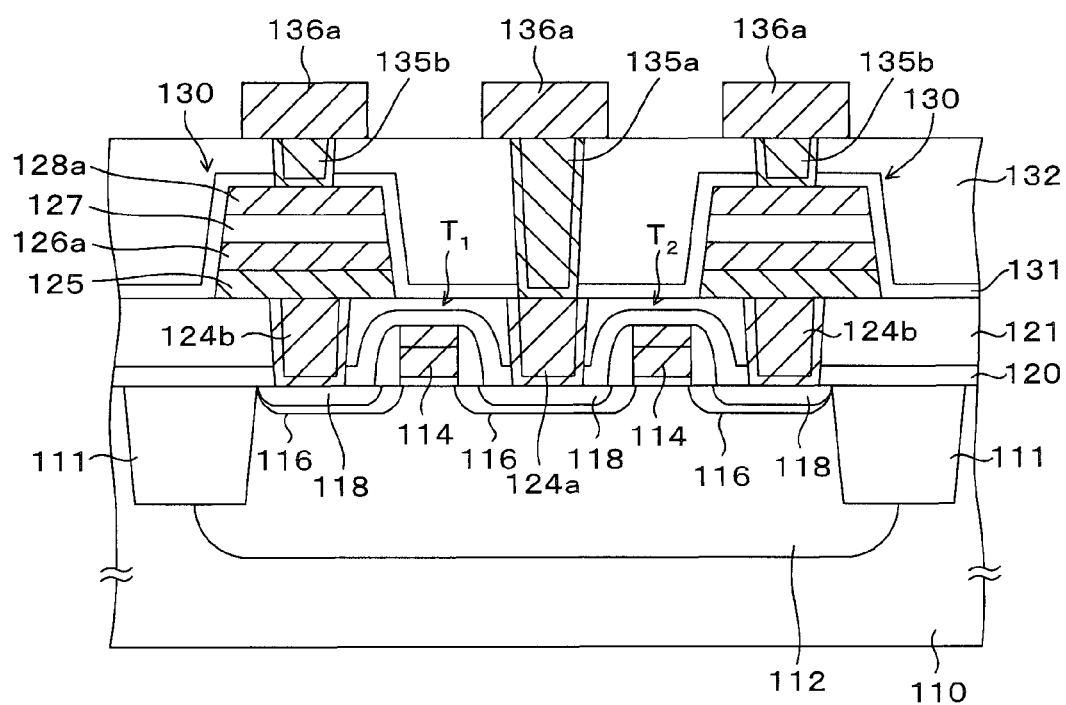
FIG. 4 is a cross-sectional view showing a semiconductor device (FeRAM) according to a first embodiment.

FIG. 4 is a cross-sectional view showing a semiconductor device (FeRAM) according to a first embodiment. In the present embodiment, the description will be given of a case where a transistor constituting a memory cell is an n-type transistor.

In an upper portion of a semiconductor substrate 110, device isolation layers 111 for isolating device regions are provided. In addition, a p-well 112 and an n-well (not shown) is provided in each of the device regions isolated by the device isolation layers 111. As shown in FIG. 4, in a memory cell region, two transistors T1 and T2 are formed with respect to one p-well 112. That is, two gate electrodes 114 are formed on the p-well 112 in the memory cell region so as to be arranged in parallel with respect to each other. In a vicinity of a surface of the p-well 112 on both side of these gate electrodes 114, low-concentration n-type impurity regions 116 and high-concentration n-type impurity regions 118, which are to be source/drain of the transistors T1 and T2, are formed.

A stopper layer 120 is formed on the semiconductor substrate 110 so as to cover the gate electrodes 114, and a first interlayer insulating film 121 is formed on the stopper layer 120. In this first interlayer insulating film 121, Cu (copper) plugs 124a and 124b, which pass through the stopper layer 120, are formed. The Cu plugs 124a and 124b are electrically connected to the n-type impurity regions 118. The Cu plug 124a is connected to the n-type impurity region 118 provided between the two gate electrodes 114, whereas the Cu plugs 124b are connected to the n-type impurity regions 118 provided between the gate electrodes 114 and the device isolation layers 111. Upper surfaces of the interlayer insulating film 121, the Cu plugs 124a and 124b are planarized by either low-pressure CMP or ECMP.

On the Cu plugs 124b and the interlayer insulating film 121 in the vicinity thereof, ferroelectric capacitors 130 are formed. Each of the ferroelectric capacitors 130 is constructed by sequentially laminating, a barrier metal 125, a lower electrode 126a, a ferroelectric film 127, and an upper electrode 128a in this order. Note that the lower electrode 126a of the ferroelectric capacitor 130 is electrically connected to the Cu plug 124b through the barrier metal 125.

A protective film 131 is formed on the first interlayer insulating film 121 and the ferroelectric capacitors 130, and a second interlayer insulating film 132 is formed on this protective film 131. In the second interlayer insulating film 132, a plug 135a and plugs 135b are formed. The plug 135a is connected to the Cu plug 124a and plugs 135b are connected to the upper electrodes 128a of the capacitors 130. In addition, on the second interlayer insulating film 132, a wiring 136a connected to the plug 135a and wirings 136b connected to the plugs 135b are formed.

In the semiconductor device (FeRAM) with such a structure according to the present embodiment, the gate electrodes 114 of the transistors T1 and T2 in the memory cell region constitute a part of a word line, and the wiring 136a which is electrically connected to the high-concentration impurity region 118 constitutes a part of a bit line. Note that the high-concentration impurity region 118 is shared by the transistors T1 and T2.

In the present embodiment, since each ferroelectric capacitor 130 is stacked on each Cu plug 124b, much higher integration can be achieved than the FeRAM having a planar structure. In addition, in the present embodiment, each of the plugs 124b is made of Cu and the surface thereof is planarized by either the low-pressure CMP or the ECMP. Thus, the crystallinity of the barrier metal 125, the lower electrode 126a, and the ferroelectric film 127 become preferable. Hence, switching charges of the ferroelectric capacitor 130 become large, and an operation can be performed at a low voltage.

FIGS. 5A to 5G are cross-sectional views showing a method for manufacturing the semiconductor device according to the present embodiment. In general, an n-type transistor and a p-type transistor which constitute drive circuits (such as a writing circuit and a readout circuit) are formed on the semiconductor substrate along with the memory cell. However, they are not shown in the figures here.

Figure 5A:
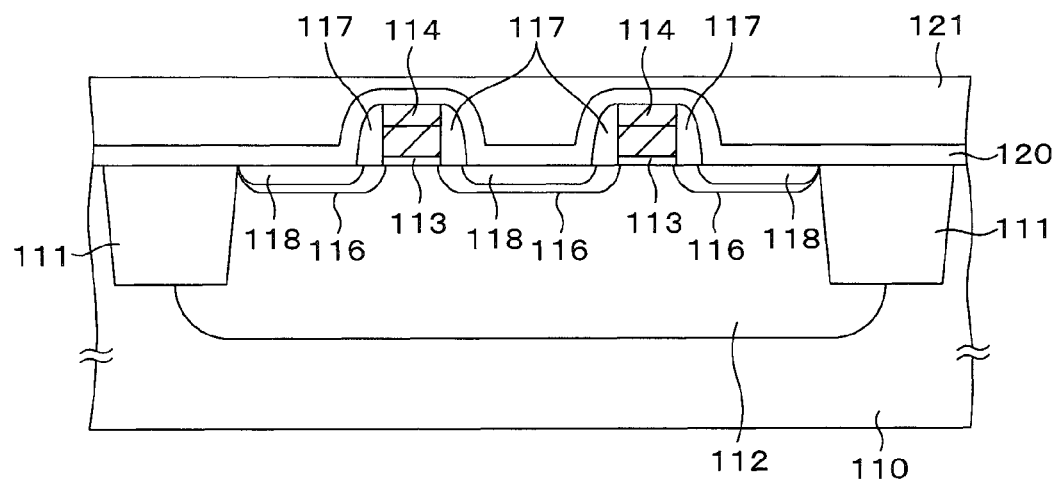
FIGS. 5A to 5G are cross-sectional views showing a method for manufacturing the semiconductor device according to a first embodiment.

Firstly, processes for obtaining a structure shown in FIG. 5A will be descried. As shown in FIG. 5A, device isolation layers 111 are formed in predetermined regions of the semiconductor substrate (silicon substrate) 110. Specifically, grooves are formed in predetermined regions of the semiconductor substrate 110 by the photolithography method. Then, an insulating material, such as $SiO_2$, is buried in the grooves to form the device isolation layers 111. The method in which the device isolation layers 111 are formed using the grooves, in which an insulating material is buried, is referred to as a shallow trench isolation (STI) method. In place of forming the device isolation layers 11 by the STI method, the device isolation layers 111 may be formed by a well-known local oxidation of silicon (LOCOS) method. Note that the semiconductor substrate 110 may be either p-type or n-type substrate.

Subsequently, in order to form a p-well 112, p-type impurities (for example boron (B) or the like) are introduced into an n-type transistor forming region (a memory cell region and an n-type transistor forming region of the driving circuit) of the semiconductor substrate 110. In addition, in order to form an n-well (not shown), n-type impurities (for example, phosphorus (P) or the like) are introduced into a p-type transistor forming region (a p-type transistor forming region of the driving circuit) of the semiconductor substrate 110.

Next, surfaces of the p-well 112 and the n-well (not shown) are thermally oxidized to form gate insulating films 113. After that, a polysilicon film is formed on an entire upper surface of the semiconductor substrate 110 by the CVD method, and then this polysilicon film is patterned by the photolithography method to form gate electrodes 114.

Note that it is preferable that the gate electrode, into which the n-type impurities are introduced, be formed over the p-well 112 and the gate electrode, into which the p-type impurities are introduced, be formed over the n-well (not shown). In addition, as shown in FIG. 5A, two gate electrodes 114 are arranged in parallel with each other over one p-well 112 in the memory cell region.

Then, n-type impurities, such as phosphorus (P), are ion-implanted into the p-well 112 in the n-type transistor forming region by using the gate electrodes 114 as a mask to form low-concentration n-type impurity regions 116. Similar to this, p-type impurities, such as boron (B), are ion-implanted into the n-well (not shown) in the p-type transistor forming region by using the gate electrodes 114 as a mask to form low-concentration p-type impurity regions (not shown).

After that, sidewalls 117 are formed on both sides of the gate electrodes 114. The sidewalls 117 are formed in such a manner that an insulating film made of $SiO_2$, SiN, or the like is formed on the entire upper surface of the silicon substrate 110 by the CVD method and thereafter the insulating film is etched back to be left only on the both sides of the gate electrodes 114.

Then, by using the gate electrodes 114 and the sidewalls 117 as a mask, the n-type impurities are ion-implanted into the p-well 112 in the n-type transistor forming region to form high-concentration n-type impurity regions 118. Similar to this, by using the gate electrode in the p-type transistor forming region and the sidewalls as a mask, the p-type impurities are ion-implanted into the n-well (not shown) to form high-concentration p-type impurity regions (not shown). In this manner, a transistor having source/drain with a lightly doped drain (LDD) structure is formed in each transistor forming region. The processes so far are basically same as general CMOS manufacturing processes.

Note that it is preferable that a metal silicide layer, such as a cobalt silicide or titanium silicide, be formed as a contact layer on surfaces of the gate electrodes 114 and the n-type impurity regions 118.

After that, a SiON film is formed with a thickness of 200 nm as a stopper layer 120 on the entire upper surface of the silicon substrate 110, and then, an $SiO_2$ film is further formed with a thickness of 1000 nm as an interlayer insulating film 121 on the stopper layer 120. Thereafter, a surface of the interlayer insulating film 121 is planarized by the general CMP.

Figure 5B:
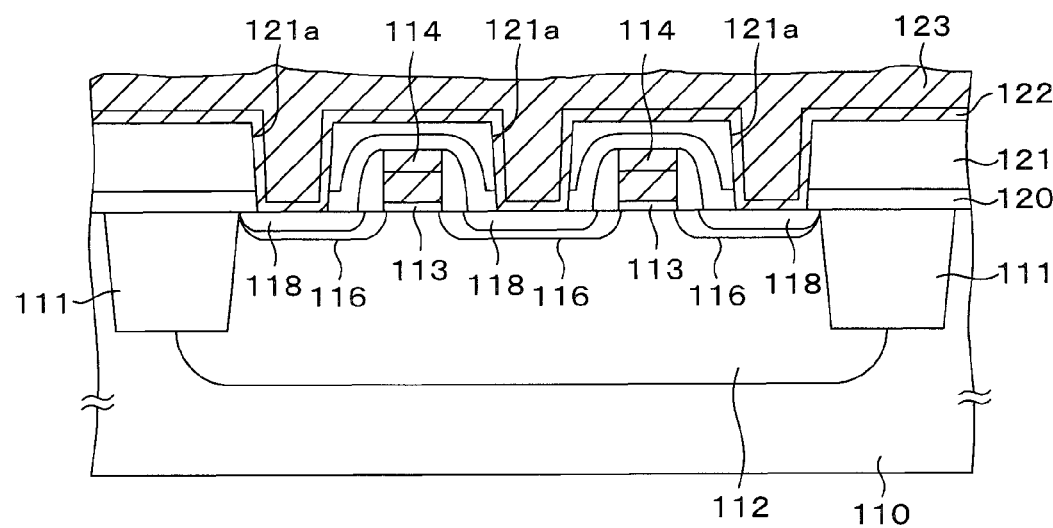

Next, processes for forming a structure shown in FIG. 5B will be described. After the surface of the interlayer insulating film 121 is planarized by the above-described process, contact holes 121a passing from the surface of the interlayer insulating film 121 to the high-concentration n-type impurity regions 118 in the n-type transistor forming region and the high-concentration p-type impurity regions (not shown) in the p-type transistor forming region, are formed by the photolithography method. Thereafter, as degas processing, annealing is carried out in an $N_2$ atmosphere at a temperature of 650° C. for 30 minutes.

Subsequently, an adhesive layer 122 is formed on the entire upper surface of the semiconductor substrate 110 by the sputtering method. The adhesive layer 122 is required to have a function to improve adhesion of the interlayer insulating film 121 to the Cu plugs 124a and 124b. Furthermore, the adhesive layer 122 is required to have functions to prevent hydrogen and moisture contained in the interlayer insulating film 121 from diffusing into the ferroelectric film 127, and to prevent Cu atoms in the Cu plugs 124a and 124b from diffusing into the interlayer insulating film 121.

In the case where the adhesive layer 122 is absent, hydrogen and moisture contained in the interlayer insulting film 121 diffuse into the plugs 124b, and further penetrate through noble metals of the barrier metal 125 and the lower electrodes 126a. As a result, the ferroelectric characteristics of the ferroelectric film 127 are deteriorated. In addition, the Cu atoms diffuse from the Cu plugs 124a and 124b into the interlayer insulating film 121, and the characteristics of the transistors T1 and T2 are significantly deteriorated.

In the present embodiment, the adhesive layer 122 is formed by sequentially laminating a Ti film with a thickness of approximately 20 nm, a TaN film with a thickness of approximately 50 nm, and a Ta film with a thickness of approximately 20 nm in this order. It is preferable that the adhesive layer 122 be formed of either a conductive film made of any one of TiAlN, Ir, IrOx, Pt, Ru, Ti, Ta, TaN, and TiN, or a layer formed by laminating at least two layers selected from these conductive films. In addition, it is preferable that a thickness of the adhesive layer 122 be 100 nm or less.

After that, a copper film 123 is formed with a thickness of approximately 500 nm on the adhesive layer 122 to bury Cu in the contact holes 121a. This Cu film 123 may be formed by any one of an electroplating method, a electroless-plating method, a physical vapor deposition (PVD) method, a metal organic chemical vapor deposition (MOCVD) method, a chemical solution deposition (CSD) method, a CVD method, a liquid source chemical vapor deposition (LSCND) method, and a combination thereof.

In the case where the Cu film 123 is formed by the electroplating method, a plating solution that contains copper sulfate and sulfuric acid as main components is used. Organic addition agent and chloride is also contained in the plating solution. A Cu concentration in the plating solution is about 14 to 60 grams per litter, and a sulfuric acid concentration is about 1 to 240 grams per litter. The organic addition agent affects uniformity, hardness, plasticity, and elastic strength of the Cu film 123, though it depends on a concentration and composition of the organic addition agent. The organic addition agent generally includes a reaction inhibitor (a polymer such as polyethylene glycol), a reaction accelerator (a sulfide component), and a stabilizer (a secondary inhibitor). Amount of the added addition agents is properly set depending on plating conditions (such as a state of plating bath, a current density, a flow rate, and the number of wafers to be processed).

In the electroless-plating method, metal is deposited on an object by a reductant (such as formalin or phosphoric acid) contained in the plating solution, and thus a metal film is formed. As the copper plating solution used in the electroless-plating method, solution manufactured by Uemura International Corporation, which uses formaldehyde as the reductant, may be used.

Figure 5C:
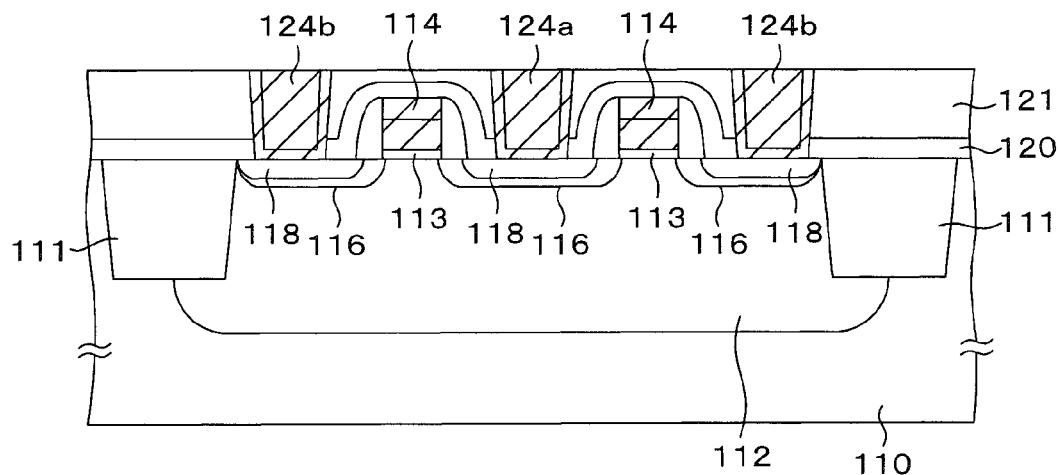

Next, processes for obtaining a structure shown in FIG. 5C will be described. After the Cu film 123 is formed in the above-described process, the Cu film 123 and the adhesive layer 122 on the interlayer insulating film 121 are removed by either the low-pressure CMP or the ECMP to planarize the films 122 and 123. Thus, the Cu film 123 is left only in each contact holes 121a, and the Cu plugs 124a and 124b are formed.

In the general CMP, a pressure of 1 to 5 psi ($6.89 \times 10^3$ Pa to $3.45 \times 10^3$ Pa) is applied to a work piece (a wafer). In contrast, in the low-pressure CMP (including ultra-low-pressure CMP), a pressure applied to the work piece is equal to or more than 0.05 psi ($3.45 \times 10^2$ Pa) and less than 1 psi ($6.89 \times 10^3$ Pa).

The ECMP polishing is a technique in which the low-pressure CMP and the electropolishing are combined. In this method, the surface of the work piece is electrolytically polished while carrying out the CMP polishing by applying, for example, a pressure of 0.5 psi ($3.45 \times 10^3$ Pa) to the work piece.

With this low-pressure CMP or the ECMP, the surface flatness of the Cu plugs 124a and 124b and the interlayer insulating film 121 become extremely preferable, so that occurrence of a recess (dishing or erosion) can be prevented.

Note that since the low-pressure CMP can polish with extremely high accuracy and precision, it is preferable to use polishing equipment of a face-up polishing method using a small-diameter polishing pad which is capable of being used at a low pressure and fast rotation. As a polishing equipment of this type, there is CMP polishing equipments of an "NPS" series (such as NPS2301 or NPS3301) manufactured by Nikon Corporation, for example. In addition, conventional general slurries can be used for the low-pressure CMP polishing. For example, HS-C430 (for Cu), HS-C800 (for Cu), H-T605 (for TaN) and H-T705 (for TaN), manufactured by Hitachi Chemical Co., Ltd., may be used.

Figure 5D:
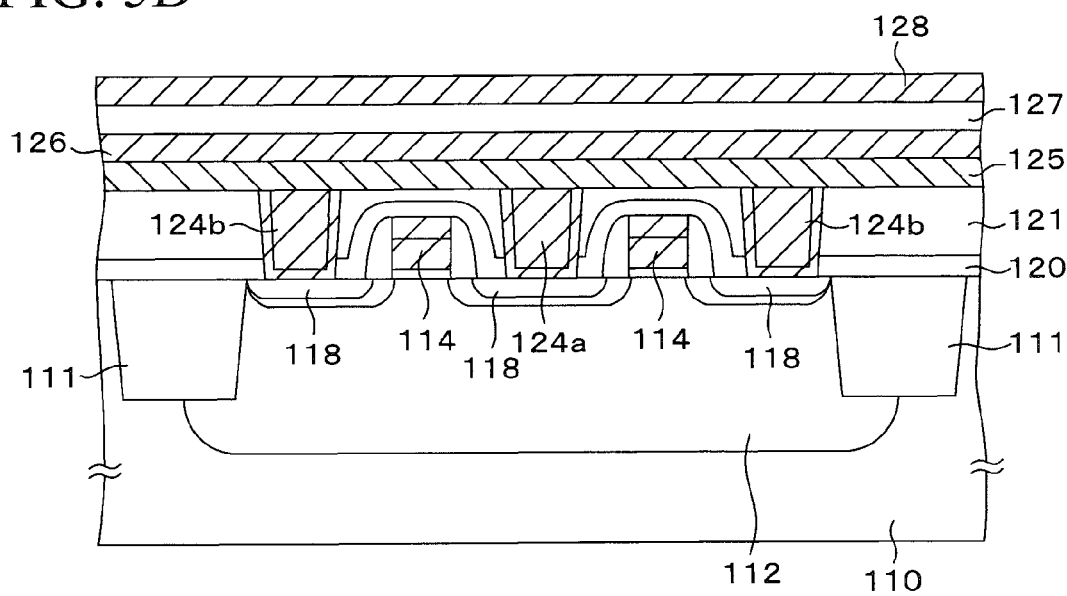

Next, processes for obtaining a structure shown in FIG. 5D will be described. After the Cu plugs 124a and 124b are formed in the above-described process, a barrier metal (an oxygen barrier layer) 125 is formed with a thickness of, for example, 100 to 200 nm on the entire upper surface of the semiconductor substrate 110 by the sputtering method. This barrier metal 125 is made of either noble metals, such as Ir and Ru, or TiAlN.

The barrier metal 125 is formed in order to prevent oxygen from diffusing into the plugs 124a and 124b in the later step of forming a ferroelectric film 127 or in the step of crystallizing the ferroelectric film 127. A conductive adhesive layer (not shown) made of any one of titanium (Ti), TiN, TiAlN, iridium (Ir), platinum (Pt), ruthenium (Ru), tantalum (Ta), or the like may be provided between the interlayer insulating film 121 and the barrier metal 125. Such conductive adhesive layer can improve the adhesiveness between the barrier metal 125 and the interlayer insulating film 121, and the crystallinity of the barrier metal 125. It is preferable that the thickness of this conductive adhesive layer be set to be 30 nm or less.

After that, a conductive film 126 to be the lower electrodes 126a of the ferroelectric capacitors 130 is formed on the barrier metal 125. The conductive film 126 is made of at least one conductive material selected from a group consisting of metals of Pt, Ir, Ru, Rh, Re, Os, and Pd, oxidants of these metals, and $SrRuO_3$.

Then, a ferroelectric film 127 made of PZT is formed on the conductive film 126 with a thickness of, for example, 120 nm by the MOCVD method. A film-forming temperature of PZT is 580° C., and $Pb(DPM)_2$ as a Pb material, $Zr(dmhd)_4$ as a Zr material, $Ti(O\text{-}iPr)_2(DPM)_2$ as a Ti material, are used. Flow rates of $Pb(DPM)_2$, $Zr(dmhd)_4$, $Ti(O\text{-}iPr)_2(DPM)_2$ are respectively set to 0.32 ml per minute, 0.2 ml per minute, and 0.2 ml per minute. In addition, a partial pressure of oxygen is set to be 5 Torr ($6.65 \times 10^2$ Pa). The above-described materials are dissolved in the THF (tetrahydrofuran) with a molar ratio of 3%, and are transferred to a vaporizer in the state of liquid. Then, a temperature of the vaporizer is set to, for example, 260° C., so that the THF and the materials are vaporized to be mixed with oxygen, and thereafter they are sprayed onto the semiconductor substrate 110 through a showerhead. A film-forming time is, for example, 420 seconds. When the compositions of the PZT film formed under the above-described conditions were investigated, results were: Pb/(Zr+Ti)=1.15 and Zr/(Zr+Ti)=0.45.

The ferroelectric film 127 may be made of any one of a thin film PZT, PZT into which small amount of La, Ca, Sr, or Si is doped, PLZT, and BLT, all of which are expressed by a general formula $ABO_3$. Alternatively, the ferroelectric film 127 may be made of Bi-based layered compound, such as SBT or SBTN. The crystal structure of the ferroelectric film 127 may be a perovskite structure or a bismuth layered structure as in the above. Note that in the present embodiment, the ferroelectric film 127 is formed by the MOCVD method, but it may be formed by the sputtering method, a sol-gel method, or the CVD method.

After forming the ferroelectric film in this manner, RTA (rapid thermal annealing) processing is carried out in an atmosphere containing oxygen to crystallize the ferroelectric film 127. In the present embodiment, the first RTA processing is carried out in a mixed gas of argon (Ar) and $O_2$ under conditions of a substrate temperature of 600° C. and a processing time of 90 seconds. Thereafter, the second RTA processing is carried out in an oxygen atmosphere under conditions of a substrate temperature of 750° C. and a processing time of 60 seconds. Even when such RTA processing is carried out under these conditions, the conductive film 126 is less likely oxidized and film exfoliation is not caused, because the conductive film 126 is made of a noble metal. In addition, since the Cu plugs 124a and 124b are covered with the barrier metal 125, the Cu plugs 124a and 124b are not oxidized.

Then, a conductive film 128 to be the upper electrodes 128a of the capacitors 130 is formed on the ferroelectric film 127 with a thickness of, for example, 200 nm. In the present embodiment, the conductive film 128 is made of $IrO_2$. This conductive film 128 may be made of at least one metal film selected from a group consisting of platinum (Pt), iridium (Ir), ruthenium (Ru), rhodium (Rh), rhenium (Re), osmium (Os), palladium (Pd), and $SrRuO_3$, oxide films of these metals, or a film in which at least two of these films are laminated.

Figure 5E:
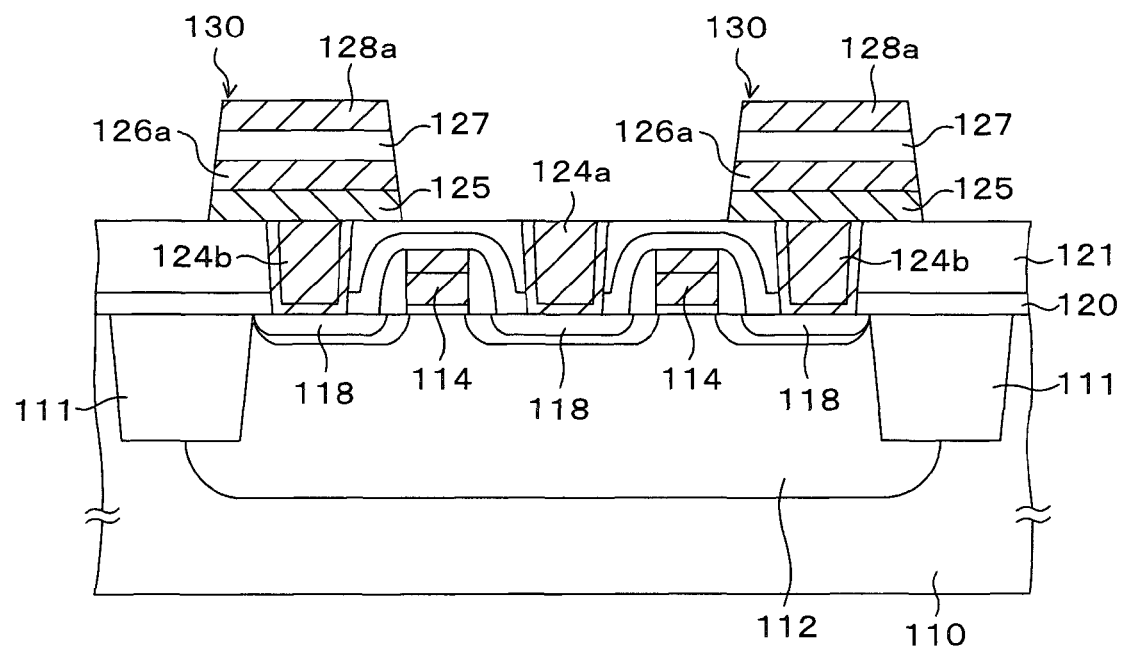

Next, processes for obtaining a structure shown in FIG. 5E will be described below. After forming the barrier metal 125, the conductive film 126, the ferroelectric film 127, and the conductive film 128 in the above-described processes, a hard mask (not shown) having a laminated structure of, for example, a TiN film and an $SiO_2$ film is formed on a predetermined region of the conductive film 128 (a ferroelectric capacitor forming region). Then, the conductive film 128, the ferroelectric film 127, the conductive film 126, and the barrier metal 125 are etched at the same time. Accordingly, as shown in FIG. 5E, the ferroelectric capacitors 130, each of which is constructed from the lower electrode 126a, the upper electrode 128a, and the ferroelectric film 127 therebetween are formed. After that, the hard mask is removed.

Figure 5F:
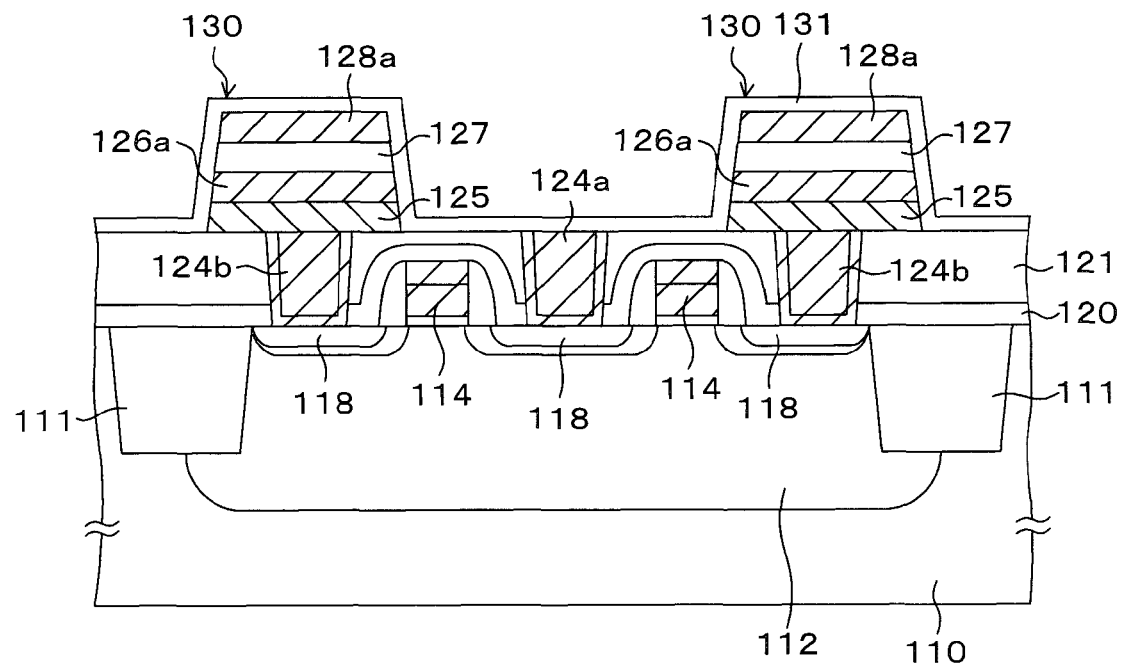
Figure 5G:
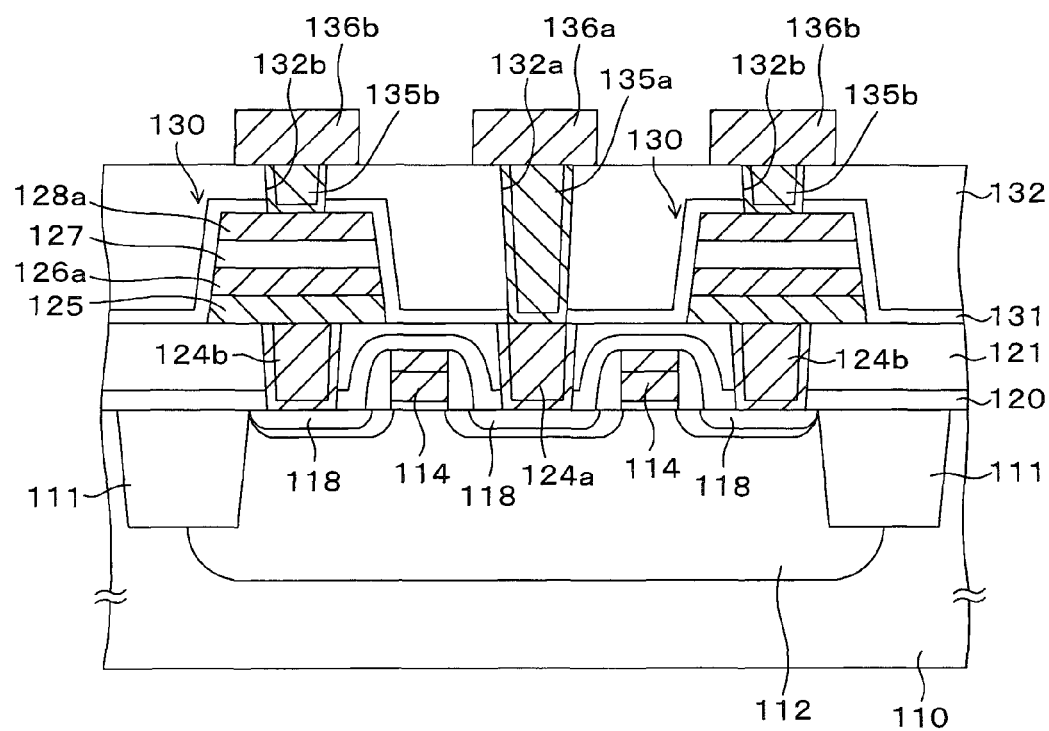

Next, processes for obtaining a structure shown in FIG. 5F will be described. After the ferroelectric capacitors 130 are formed by etching the conductive film 128, the ferroelectric film 127, the conductive film 126, and the barrier metal 125, annealing is carried out in the atmosphere containing oxygen at a temperature of 350° C. for one hour. This annealing is carried out for securing the adhesiveness of a protective film 131 to be formed in the next process.

After that, a protective film 131 for covering the ferroelectric capacitors 130 is formed with a thickness of, for example, 20 to 100 nm on the interlayer insulating film 121. This protective film 131 is made of, for example, $Al_2O_3$ (alumina) and is formed by the MOCVD method or the sputtering method.

Then, in order to recover damages in the ferroelectric film 127 received during the etching process and the process of forming the upper electrodes, recover annealing is carried out. This recovery annealing is carried out by heating the ferroelectric film 127 in a furnace in the atmosphere containing oxygen at a temperature of, for example, 550 to 650° C. for approximately 60 minutes.

Next, processes for obtaining a structure shown in FIG. 8 will be described. After the recovery annealing is carried out in the above-described process, an interlayer insulating film 132 made of, for example, $SiO_2$ is formed on the entire upper surface of the semiconductor substrate 110 by the plasma CVD method. After that, a contact hole 132a reaching the predetermined plug 124b and contact holes 132b reaching the upper electrodes 128a of the ferroelectric capacitors 130 from the surface of the interlayer insulating film 132 are formed by the photolithography method.

Then, an adhesive layer made of TiN is formed with a thickness of, for example, 50 nm on the entire upper surface of the substrate 110, and the inner surfaces of the contact holes 132a and 132b are covered with this adhesive layer. Thereafter, a W (tungsten) film is formed on the adhesive layer by the CVD method, and the contact holes 132a and 132b are filled with W film. Then, the W film on the interlayer insulating film 132 and the adhesive layer are removed by the general CMP polishing, and the W film is left only in the contact holes 132a and 132b to form plugs 135a and 135b.

After that, a laminated film is formed on the interlayer insulating film 132, in which Ti (60 nm), TiN (30 nm), an Al film (400 nm), Ti (5 nm), and TiN (70 nm) are laminated. The laminated film is patterned by the photolithography method to form wirings 136a and 136b. Then, if needed, an another interlayer insulating film and an another upper layer wiring are formed. In this manner, a semiconductor device (FeRAM) with a stack structure in which a ferroelectric capacitor 130 is stacked on a Cu plug 124b has been completed.

According to the present embodiment, the plugs 124b are made of Cu and the surfaces thereof are planarized by either the low-pressure CMP or the ECMP. Therefore, a recess (dishing or erosion) is not caused in the surfaces of the plugs 124b. Thus, the crystallinity of the ferroelectric film 127 of the ferroelectric capacitors 130 becomes preferable, so that the switching charges of the ferroelectric capacitor 130 become larger. Note that in the aforementioned Japanese Patent Laid-open No. Hei 10-242423, it is described that a Cu plug may be used in place of a W plug. However, in this patent document, only general CMP polishing is described. Even if a surface of the Cu plug is polished by the general CMP method, sufficient flatness cannot be obtained, and hence crystal disorder is caused in the lower electrode and the ferroelectric film formed on the plug. Accordingly, in order to form a dielectric film with a preferable characteristic without crystal disorder, it is needed to planarize the upper surface of the Cu plug by polishing using either the low-pressure CMP or the ECMP as in the present embodiment.

In addition, since the semiconductor device of the present embodiment uses a capacitor with a stack structure, a highly integrated semiconductor device can be provided, as compared with a semiconductor device having a capacitor with a planer structure of the same switching charges.

Furthermore, since the plugs 124a and 124b are made of Cu in the present embodiment, following advantages can also be obtained. That is, if the plugs 124a and 124b were to be made of W (tungsten), the plug 124a is exposed in the step shown in FIG. 5E, and hence W is oxidized to lose its conductivity. For this reason, it is needed that the plug 124a is formed in advance and the barrier layer (the oxygen barrier layer) is formed thereon, and thereafter the plugs 124b should be formed. Thus, increase in the number of the steps is inevitable. On the contrary, in the present embodiment, since the plugs 124a and 124b are made of Cu, which is a material difficult to be oxidized than W, the plugs 124a and 124b can be formed at the same time and the number of steps can be reduced than the case where the plugs 124a and 124b are made of W.

Note that in the present embodiment, the adhesive layer 122 on the interlayer insulating film 121 is removed at the time when the Cu film 123 is polished (by the low-pressure CMP or the ECMP). However, the adhesive layer 122 on the interlayer insulating film 121 may be removed by etching after the ferroelectric capacitors 130 are formed by etching the conductive film 128, the ferroelectric film 127, the conductive film 126, and the barrier metal 125. In this case, the adhesive layer 122 remains under the lower electrodes 136a, but it does not cause any problem in operating the semiconductor device.

Second Embodiment

Figure 6:
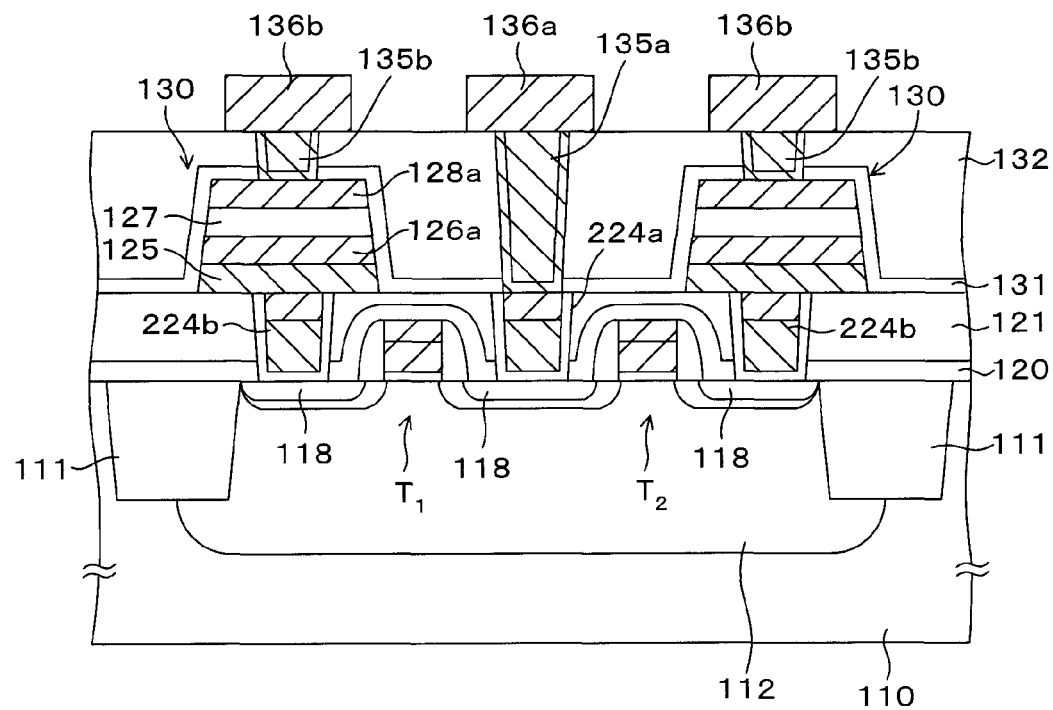
FIG. 6 is a cross-sectional view showing a semiconductor device (FeRAM) according to a second embodiment.
Figure 7:
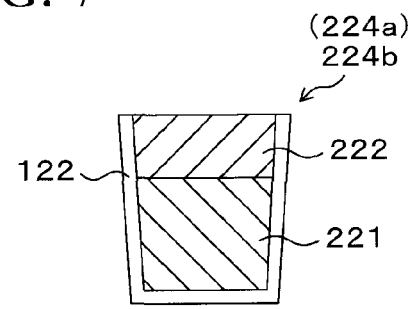
FIG. 7 is an enlarged view of plugs in FIG. 6.

FIG. 6 is a cross-sectional view showing a semiconductor device (FeRAM) according to a second embodiment. FIG. 7 is an enlarged view of a plug 224a or 224b in FIG. 6. Note in FIG. 6 that same reference numerals are given to denote components as those of FIG. 4 and detailed description thereof will be omitted.

In the present embodiment, as shown in FIG. 7, plugs 224a and 224b, which corresponds to the plugs 124a and 124b in the first embodiment, are formed by laminating a W film 221 and a Cu film 222. According to this structure, an amount of Cu in the plugs 224a and 224b is smaller by the amount of the W film. For this reason, even if a layer thickness of an adhesive layer 122 is thin and thus a contamination preventive function of the layer 122 against Cu is weak, an amount of Cu atoms diffusing into an interlayer insulating film 121 is small. Thus, characteristics of transistors T1 and T2 can be prevented from being deteriorated due to Cu contamination.

Figure 8A:
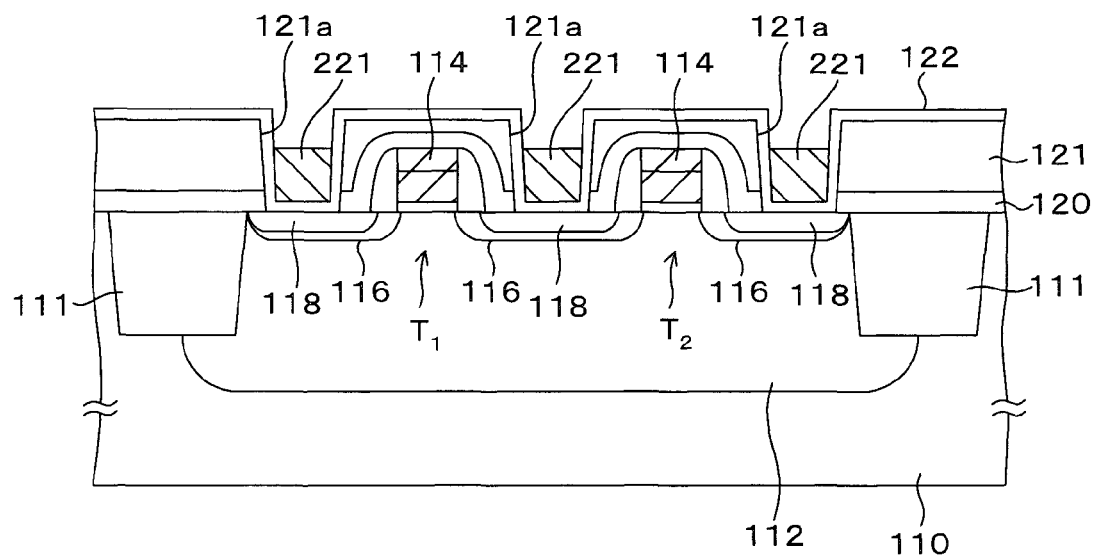
FIGS. 8A and 8B are cross-sectional views showing a method for manufacturing the semiconductor device according to a second embodiment.
Figure 8B:
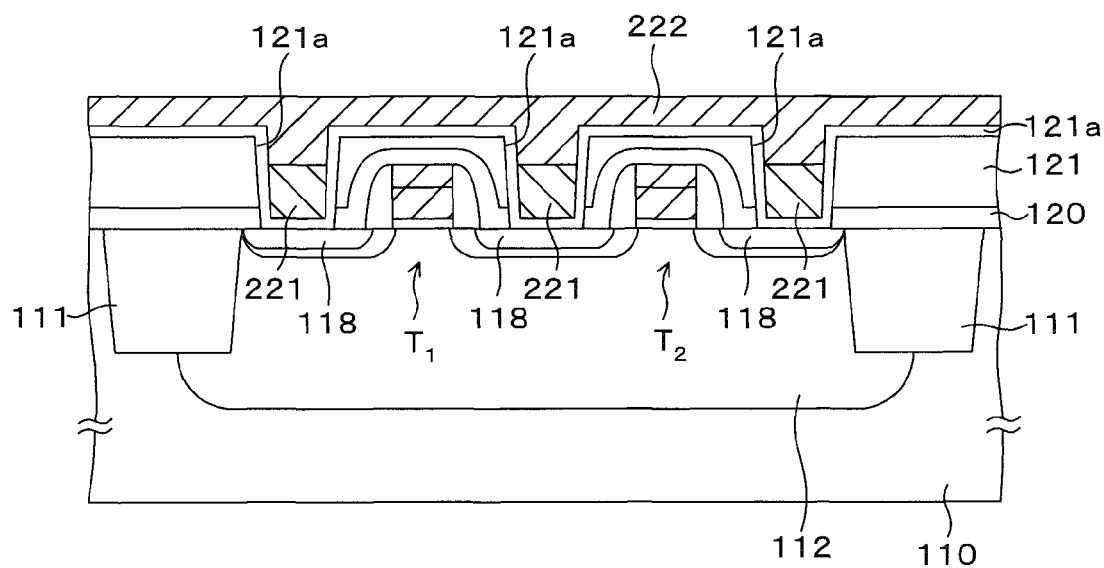

FIGS. 8A and 8B are cross-sectional views showing a method for manufacturing the semiconductor device according to the present embodiment.

Firstly, as shown in FIG. 8A, similar to the first embodiment, device isolation layers 111, a p-well 112, transistors T1 and T2, a stopper layer 120 and a first interlayer insulating film 121 are formed on a semiconductor substrate 110. After that, a surface of a second interlayer insulating film 121 is planarized by the general CMP polishing, and then contact holes 121a passing from the surface of the second interlayer simulating film 121 through high concentration n-type impurity regions 118 are formed.

Next, an adhesive layer 122 made of, for example, TiN or TiAlN is formed on an entire upper surface of the semiconductor substrate 110 by the sputtering method to cover wall surfaces of the contact holes 121a with the adhesive layer 122. After that, a W film 221 is formed on the entire surface of the adhesive layer 122 by the CVD method or the like. Thus, the contact holes 121a are buried with W. Then, this W film 221 is etched back to reduce the thickness of the W film to intermediate depth of contact holes 121a. Etching conditions in this case are, for example, as follows.

A parallel plate dry etching equipment is used in this etching, and $SF_6$ with a flow rate of 400 ml per minute and $O_2$ with a flow rate of 200 ml per minute are introduced into the etching equipment. Then, the W film 221 is etched under conditions of a pressure of 60 Pa, RF power of 300 W, and a wafer stage temperature of 30° C. In this case, since an etching rate of the adhesive layer 122 made of TiN or TiAlN is lower than that of the W film 221, the thickness of W film 221 can be reduced to the intermediate depth of contact holes 121a, while leaving the adhesive layer 122. Note that it is not necessary that the upper surface of the W film 221 in the contact holes 121a is flat.

Next, as shown in FIG. 8B, a Cu film 222 is formed on the entire upper surface of the silicon substrate 110, so that contact hole 121a is filled with Cu. After that, the Cu film 222 and the adhesive layer 122 on the interlayer insulating film 121 are removed by either the low-pressure CMP or the ECMP to leave the Cu film only in the contact holes 121a. By the low-pressure CMP and the ECMP, plugs 224a and 224b free from recesses on their upper surfaces can be formed. For the low-pressure CMP, it is preferable to use a polishing equipment of a face-up method using a small-diameter polishing pad capable of being used at a low pressure and rotating at a high speed, such as CMP polishing equipment of "NPS" series (NPS2301 and NPS3301) manufactured by Nikon Corporation. With regard to slurries, HS-C430 (for Cu), HS-C800 (for Cu), H-T605 (for TaN), H-T705 (for TaN), each manufactured by Hitachi Chemical Co., Ltd., are used. A polishing pressure of the low-pressure CMP is set to equal to or more than 0.05 Pa and less than 1 Pa.

Next, similar to the first embodiment, a barrier metal 125 is formed on the plugs 224b, and ferroelectric capacitors 130, each of which is constructed from a lower electrode 126a, a ferroelectric film 127, and an upper electrode 128a, are further formed thereon (see, FIG. 6). Then, a protective film 131 covering these ferroelectric capacitors 130 is formed and a second interlayer insulating film 132 is further formed on the protective film 131. Thereafter, a plug 135a connected to the plug 224a and plugs 135b connected to the upper electrodes 128a of the ferroelectric capacitors 130 are formed, and wirings 136a and 136b connected to these plugs 135a and 135b are formed on the second interlayer insulating film 132. In this manner, the semiconductor device according to the second embodiment has been completed.

According to the present embodiment, since the low-pressure CMP and the ECMP are used, the upper surfaces of the plugs 224b become flat. Therefore, the crystal disorder of the ferroelectric film 127 of the capacitors 130 formed on the plugs 224b is avoided. Accordingly, similar to the first embodiment, a semiconductor device with a large amount of switching charges, a capability of operating at a low voltage, and high reliability, can be manufactured.

Note that the plugs 224a and 224b are formed by laminating the W film 221 and the Cu film 222 in the contact holes 121a in the above-described present embodiment. However, a film made of polysilicon or other conductive materials may be formed in place of the W film 221.

In addition, in the above-described present embodiment, the W film 221 is etched back to form gaps in upper portions of the contact holes 121a, and the gaps are buried with Cu to form the plugs 224a and 224b with a structure in which the W film 221 and the Cu film 222 are laminated. However, the plugs 224a and 224b may be formed by another method. For example, the first interlayer insulating film 121 is formed to its intermediate depth, and thereafter contact holes reaching the high-concentration n-type impurity regions 118 are formed. Then, a conductive adhesive layer covering the wall surfaces of the contact holes are formed. After that, the contact holes are buried by the W film, and the W film and the adhesive layer on the first interlayer insulating film 121 are removed by the CMP. Then, a residual portion of the first interlayer insulating film 121 is formed, and thereafter contact holes reaching the W film and a conductive adhesive layer covering wall surfaces of the contact holes are formed. After that, the contact holes are buried by the Cu film, and the Cu film and the adhesive layer on the first interlayer insulating film 121 are removed by either the low pressure CMP or the ECMP to planarize the surface. In this manner, the plugs 224a and 224b with a structure in which the W film 221 and the Cu film 222 are laminated can be formed.

Third Embodiment

Figure 9:
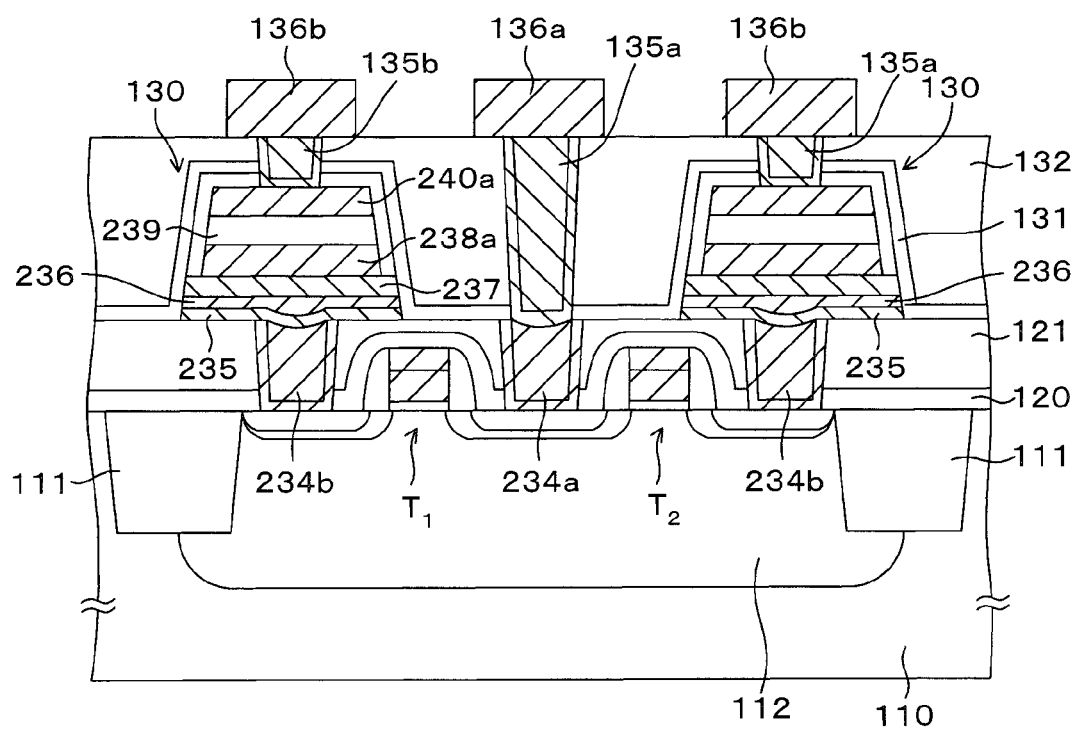
FIG. 9 is a cross-sectional view showing a semiconductor device (FeRAM) according to a third embodiment.

FIG. 9 is a cross-sectional view showing a semiconductor device (FeRAM) according to a third embodiment. Note in FIG. 9 that the same reference numerals are given to denote the same components as those of FIG. 4, and detailed description thereof will be omitted.

In the present embodiment, plugs 234a and 234b corresponding to the plugs 124a and 124b of the first embodiment are made of W (or polysilicon), and a recess (dishing or erosion) is caused on surfaces of these plugs 234a and 234b. In addition, a conductive adhesive layer 235, a Cu film 236, and a barrier metal 237 are formed between the plugs 234b and ferroelectric capacitors 130. The Cu film 236 is provided to compensate the recess on the surfaces of the plugs 234b. The surface of the Cu film 236, on which the ferroelectric-capacitor is formed, is planarized by either the low-pressure CMP or the ECMP.

Figure 10A:
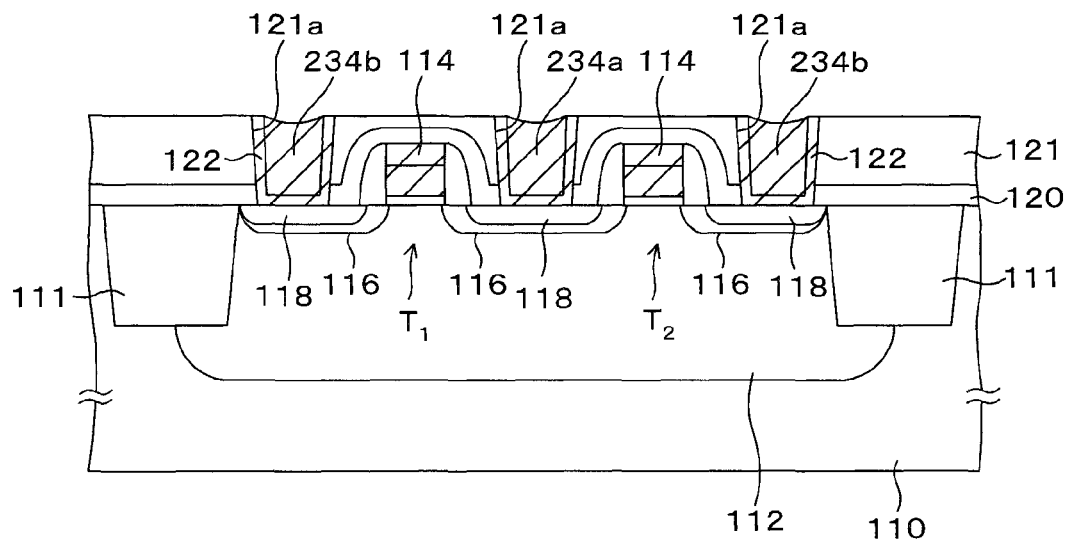
FIGS. 10A to 10D are cross-sectional views showing a method for manufacturing the semiconductor device according to a third embodiment.

FIGS. 10A to 10D are cross-sectional views showing a method for manufacturing the semiconductor device according to the present embodiment. Firstly, as shown in FIG. 10A, similar to the first embodiment, the device isolation layers 111, the p-well 112, the transistors T1 and T2, the stopper layer 120, and the first interlayer insulating film 121 are formed on the semiconductor substrate 110. After that, a surface of the first interlayer insulating film 121 is planarized by the general CMP, and thereafter contact holes 121a passing from the surface of the interlayer insulating film 121 through high-concentration n-type impurity regions 118 are formed.

Next, an adhesive layer 122 made of TiN or TiAlN is formed on an entire upper surface of the semiconductor substrate 110 by the sputtering method to cover wall surfaces of the contact holes 121a with the first conductive adhesive layer 122. After that, a W film is formed with a thickness of, for example, 500 nm on the entire surface by the CVD method to bury the contact holes 121a with W. Then, the W film 241 and the adhesive layer 122 on the interlayer insulating film 121 are removed by the general CMP to leave the W film only in the contact holes 121a, so that the plugs 234a and 234b are formed. In this CMP polishing, recesses (dishing or erosion) are caused on surfaces of the plugs 234a and 234b. Note that the plugs 234a and 234b are made of W here, but it may be made of polysilicon.

Figure 10B:
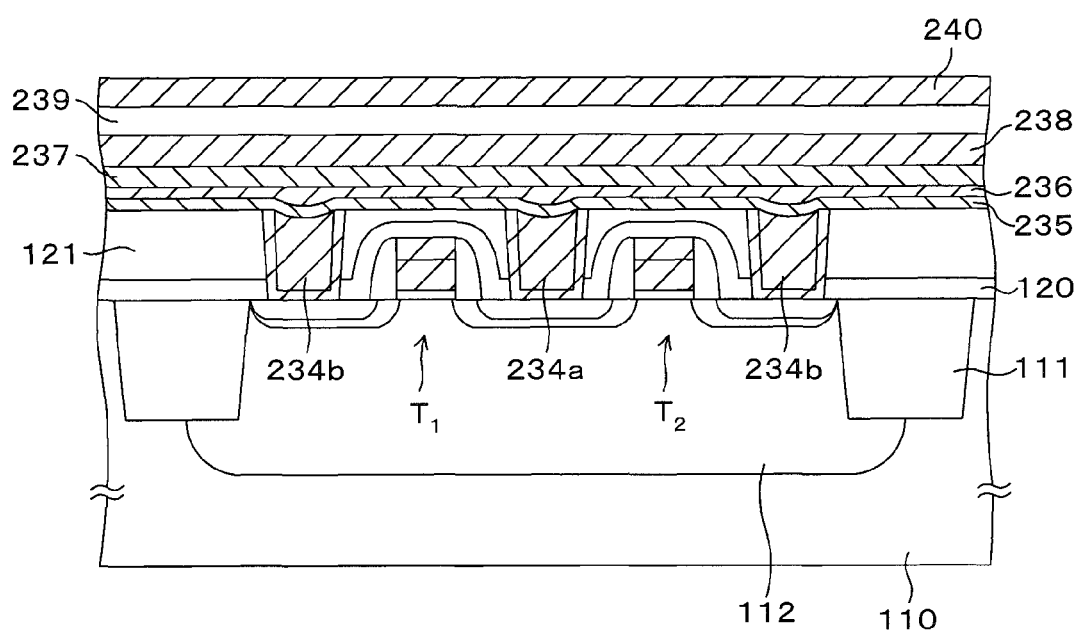

Next, as shown in FIG. 10B, a second conductive adhesive layer 235 is formed on the plugs 234a and 234b and the interlayer insulating film 121 with a thickness of, for example, 20 nm or less. This adhesive layer 235 is made of a conductive material selected from a group consisting of, for example, Ti, TiN, TiAlN, Ir, IrOx, Pt, Ru, and Ta.

Next, a Cu film 236 is formed on the adhesive layer 235 with a thickness of approximately 100 nm. Then, either the low-pressure CMP or the ECMP is carried out on this Cu film 236 to planarize the surface thereof. For the low-pressure CMP, it is preferable to use polishing equipment with a face-up method using a small-diameter polishing pad capable of being used at a low pressure and rotating at a high speed, such as CMP polishing equipment of "NPS" series (NPS2301 and NPS3301) manufactured by Nikon Corporation. In addition, with regard to the slurries, HS-C430 (for Cu), HS-C800 (for Cu), H-T605 (for TaN), and H-T705 (for TaN), each manufactured by Hitachi Chemical Co., Ltd., are used.

After that, a TiAlN film is formed with a thickness of, for example, 100 to 200 nm on the Cu film 236 as a barrier metal 237, and then a conductive film (for example, an Ir film) 238 to be a lower electrode of a ferroelectric capacitor and a ferroelectric film (for example, a PZT film) 239 are further formed thereon. Subsequently, RTA processing is carried out to crystallize the ferroelectric film 239, and thereafter a conductive film (for example, an IrOx film) 240 to be an upper electrode of the ferroelectric capacitor is formed on the ferroelectric film 239.

Figure 10C:
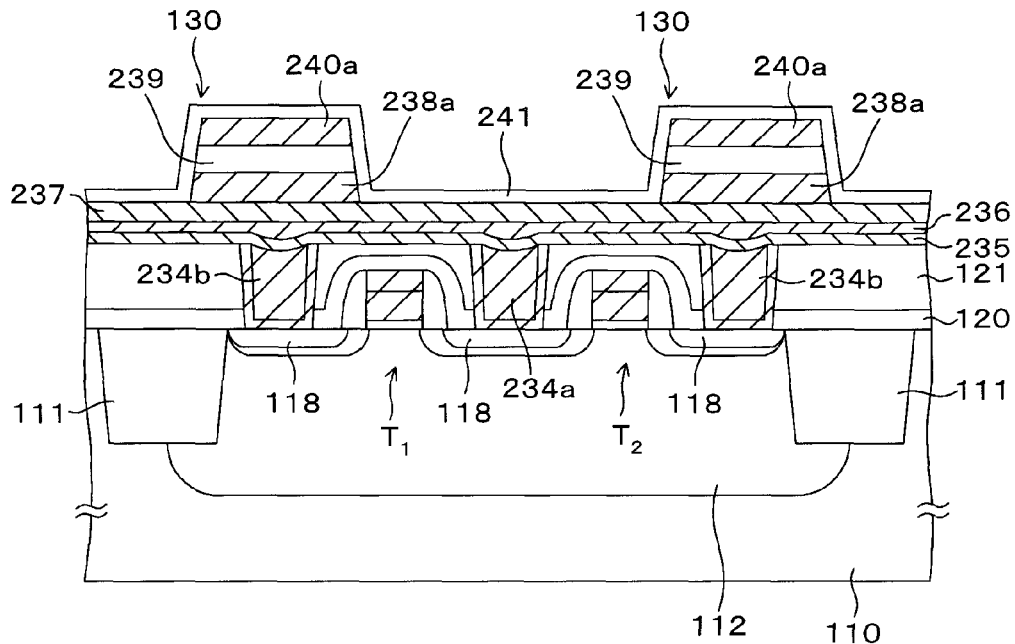

Next, a hard mask (not shown) with a laminated structure of a TiN film and a $SiO_2$ film is formed on a predetermined region of the ferroelectric film 240. Then, as shown in FIG. 10C, the conductive film 240, the ferroelectric film 239, and the conductive film 238 are etched to form ferroelectric capacitors 130, each of which is constructed from a lower electrode 238a, a ferroelectric film 239, and an upper electrode 240a. After that, the hard mask is removed, and then a protective film 241 made of $Al_2O_3$ is formed on the entire upper surface of the semiconductor substrate 110 with a thickness of 20 to 100 nm. Thereafter, in order to recover damages in the ferroelectric film 239 received due to the etching, recovery annealing is carried out in an oxygen atmosphere.

Figure 10D:
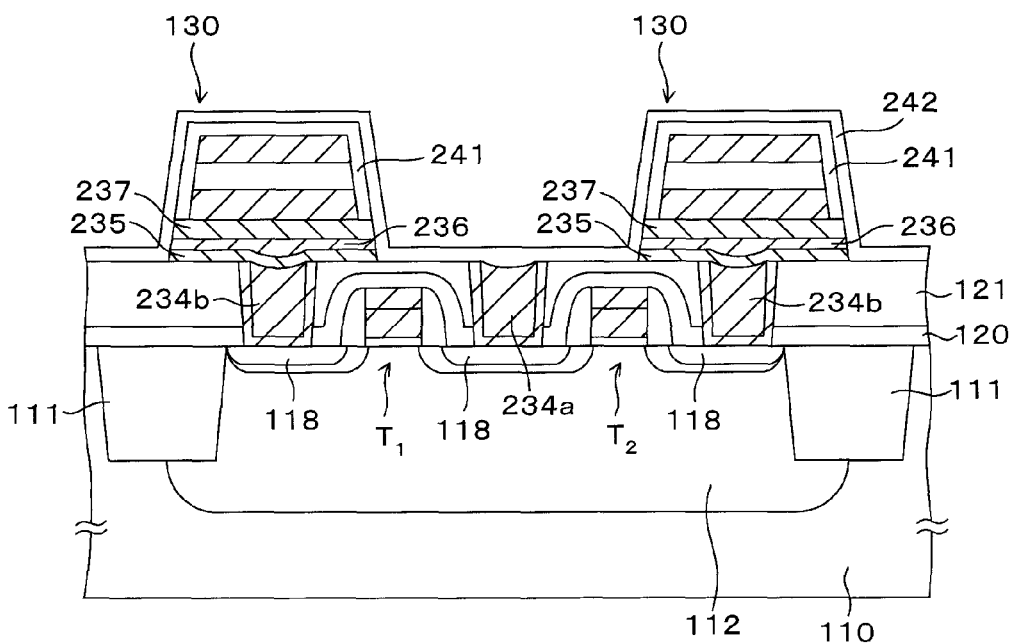

Next, the capacitors 130 are covered by a resist (not shown). Then, as shown in FIG. 10D, the protective film 241, the barrier metal 237, the Cu film 236, and the adhesive layer 235 are etched. After that, a protective film 242 made of $Al_2O_3$ is formed with a thickness of 20 to 100 nm on the entire upper surface of the semiconductor substrate 110. Then, as shown in FIG. 9, similar to the first embodiment, a second interlayer film 132 is formed, and a plug 135a connected to the plug 234a and plugs 135b connected to the upper electrodes 240a of the ferroelectric capacitors 130 are formed. Furthermore, a wiring 136a connected to the plug 135a and wirings 136b connected to the plugs 135b are formed on the second interlayer insulating film 132. In this manner, the semiconductor device according to the present embodiment has been completed.

In the present embodiment, the Cu film 236 is formed on the W plugs 234b, and then the Cu film 236 is planarized by either the low-pressure CMP or the ECMP. Thereafter, the barrier metal 237, the lower electrode 238, and the ferroelectric film 239 are formed on the planarized surface. Therefore, the crystal disorder of the ferroelectric film 239 due to unevenness of the underlying layer can be avoided. Accordingly, similar to the first embodiment, a semiconductor device with a large amount of switching charges, a capability of operating at a low voltage, and high reliability, can be manufactured.

Note that in all of the above-described first to third embodiments, the description was given to an example of FeRAM. However, the above embodiments can also be applied to DRAM in which the capacitor insulating film is made of high dielectrics, such as $(BaSr)TiO_3$, $SrTiO_3$, and $BaTiO_3$.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:
   forming an impurity region by introducing impurities into a semiconductor substrate;
   forming an interlayer insulating film over the semiconductor substrate;
   forming a contact hole reaching the impurity region in the interlayer insulating film;
   forming a first conductive adhesive layer covering a wall surface of the contact hole;
   forming a conductive plug by burying a conductive material in the contact hole;
   forming a second conductive adhesive layer on the interlayer insulating film and the conductive plug;

forming a copper film on the second conductive adhesive layer and the interlayer insulating film;

planarizing the copper film by low-pressure chemical mechanical polishing (CMP) or electro chemical mechanical polishing (ECMP);

sequentially forming a lower electrode material film, a dielectric film made of a ferroelectric or a high dielectric, and an upper electrode material film in this order on the copper film;

forming a capacitor by patterning the upper electrode material film, the dielectric film, and the lower electrode material film;

forming a protective film over the copper film and on the capacitor; and leaving only a part of the protective film, a part of the copper film and a part of the second conductive adhesive layer, the part of the protective film covering the capacitor, the part of the copper film which is formed under the capacitor and the part of the protective film and which is larger in width than the capacitor, and the part of the second conductive adhesive layer which is formed under the part of the copper film and which is larger in width than the capacitor, by patterning the protective film, the copper film and the second conductive adhesive layer.

2. The method for manufacturing a semiconductor device according to claim 1, wherein a pressure at the time of the low-pressure CMP or the ECMP is equal to or more than 0.05 psi ($3.45 \times 10^2$ Pa) and less than 1 psi ($6.89 \times 10^3$ Pa).

3. The method for manufacturing a semiconductor device according to claim 1, wherein the conductive material buried in the contact hole is either tungsten or polysilicon.

4. The method for manufacturing a semiconductor device according to claim 1, wherein the first conductive adhesive layer is made of a conductive material selected from a group consisting of Ti, TiN, TiAlN, Ir, IrOx, Pt, Ru, and Ta.

5. The method for manufacturing a semiconductor device according to claim 1, wherein the second conductive adhesive layer is made of a conductive material selected from a group consisting of Ti, TiN, TiAlN, Ir, IrOx, Pt, Ru, and Ta.

6. The method for manufacturing a semiconductor device according to claim 1, wherein the copper film is formed by any one of a plating method, a chemical solution deposition (CSD), a chemical vapor deposition (CVD) method, a metal organic chemical vapor deposition (MOCVD) method, a liquid source chemical vapor deposition (LSCVD) method, and a physical vapor deposition (PVD) method.

7. The method for manufacturing a semiconductor device according to claim 1, wherein a barrier metal made of a conductive material selected from a group consisting of TiAlN, Ir, and Ru is formed on the copper film, and the lower electrode of the capacitor is formed on the barrier metal.

8. The method for manufacturing a semiconductor device according to claim 1, wherein the dielectric film is made of a dielectric selected from a group consisting of PZT, PLZT, BLT, and SBT.

9. The method for manufacturing a semiconductor device according to claim 1, wherein only an upper surface of the capacitor, a sidewall surface of the capacitor and an upper surface of the part of the copper film are covered with the part of the protective film in the leaving of only the part of the protective film, the part of the copper film and the part of the second conductive adhesive layer.

* * * * *